United States Patent
Gidon et al.

(10) Patent No.: US 6,788,718 B1
(45) Date of Patent: Sep. 7, 2004

(54) IMPLEMENTATION OF ULTRAHIGH FREQUENCY EMITTERS AND APPLICATIONS TO RADAR AND TELECOMMUNICATIONS

(75) Inventors: Serge Gidon, La Murette (FR); Engin Molva, Grenoble (FR); Philippe Thony, St. Joseph de Rivière (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/530,316
(22) PCT Filed: Nov. 13, 1998
(86) PCT No.: PCT/FR98/02419
§ 371 (c)(1), (2), (4) Date: Apr. 27, 2000
(87) PCT Pub. No.: WO99/26312
PCT Pub. Date: May 27, 1999

(30) Foreign Application Priority Data

Nov. 14, 1997 (FR) .............................. 97 14301

(51) Int. Cl.[7] ............................................. H01S 3/13
(52) U.S. Cl. ............... 372/32; 372/29.016; 372/29.023; 372/26; 372/6; 372/102
(58) Field of Search ...................... 372/29.016, 32, 372/26, 102, 99, 29.023

(56) References Cited

U.S. PATENT DOCUMENTS

| | | | |
|---|---|---|---|
| 4,739,334 A | * 4/1988 | Soref | 342/368 |
| 5,307,073 A | 4/1994 | Riza | |
| 5,374,935 A | * 12/1994 | Forrest | 342/368 |
| 6,009,115 A | * 12/1999 | Ho | 372/92 |
| 6,061,369 A | * 5/2000 | Conradi | 372/26 |

FOREIGN PATENT DOCUMENTS

| | | |
|---|---|---|
| EP | 0 653 824 A1 | 5/1995 |
| EP | 0 724 316 A1 | 7/1996 |
| EP | 0 793 291 A2 | 9/1997 |
| JP | 61234633 | 10/1986 |
| WO | WO 90/09688 | 8/1990 |

OTHER PUBLICATIONS

Jean–Jacques Aubert, "Q–Switched Microchip Lasers Bring New Applications to Light," *Laser Focus World*, Jun. 1995, pp S11–S13.

M. Brunel et al., "Differential Measurement of the Coupling Constant Between Laser Eigenstates," *Appl. Phys. Lett.*, 70 (16) Apr. 21, 1997, pp 2070–2072.

Grosskopf, "Optical Fibres Deliver Microwave Broadcasts," *Ole*, Sep. 1996, pp 55–61.

* cited by examiner

Primary Examiner—Leon Scott, Jr.
(74) Attorney, Agent, or Firm—Harness, Dickey & Pierce, P.L.C.

(57) ABSTRACT

The invention concerns an ultrahigh frequency emitting device, having:
- at least a first and a second microlaser (22, 24), emitting at two different frequencies $\omega_1$ and $\omega_2$,
- means of slaving the first and the second microlaser frequency-wise,
- an array of N elements (N≧2) (52, 54, 56, 58) placed on the path of the beam of the second laser, each element making it possible to impose a phase delay on the beam which passes through it,
- N means (26, 28, 30, 32) for mixing the beam emitted by the first laser and each of the N delayed beams, and for producing N signals of frequency $\omega_1 – \omega_2$,
- N antenna-forming means (34, 36, 38, 40) for emitting radiation at the frequency $\omega_1 – \omega_2$.

23 Claims, 8 Drawing Sheets

IMPLEMENTATION OF ULTRAHIGH FREQUENCY EMITTERS AND APPLICATIONS TO RADAR AND TELECOMMUNICATIONS

TECHNICAL FIELD AND PRIOR ART

The invention concerns the field of optical sources, and their use as components in ultrahigh frequency emitter arrays.

Ultrahigh frequency emitters making use of optical sources are used in the field of optical ultrahigh frequency telecommunications, as described in the document by G. Grosskopf entitled "Optical fibres deliver microwave broadcasts" published in O.L.E., Sep. 1996, p. 55–61.

One possible application of the invention is therefore "picocellular radiotelephony" with the use of the fiber telecommunication network as the channel for transporting information to the radiating points.

The generation of ultrahigh frequency signals by optical signal heterodyning requires light sources of the laser source type, shifted frequency-wise by the value of the ultrahigh frequency sought.

This frequency shift can be obtained in different ways:

a) with two lasers, there can be obtained, if they have slightly different optical cavity lengths, two emitters with slightly shifted wavelengths, and therefore with emission frequencies capable of differing by that of the ultrahigh frequency to be generated.

This principle of the optical transportation of ultrahigh frequency signals is shown in FIG. 1.

Two optical sources 2, 4, emit respectively radiation at the frequency $\Omega$ and $\Omega+\omega$ and are coupled to a mixer 6 (a photodiode) by means of optical fibers 8, 10. The part 12, situated beyond the mixer, forms the antenna. A device 14 makes it possible also to slave the two lasers frequency-wise.

b) Within a single laser cavity, it is possible to make two modes of oscillation coexist simultaneously (with orthogonal, linear or circular polarization states), whose frequency difference can be adjusted to the value of the ultrahigh frequency sought. Such a system is for example described in the document by M. Brunel et al. entitled "Differential measurement of the coupling constant between laser eigenstates" published in Applied Physics Letters, vol. 70, no. 16, April 1997.

Other methods are known, like the use of an optical frequency shifter (typically, an acousto-optical modulator) for obtaining two sources shifted frequency-wise. This technique is not compatible with the frequencies sought ($\approx 10$ GHz).

All the known devices pose a problem of size.

Moreover, in the known devices, correction devices are necessary on account of the over-large spectral width of the optical signal.

Finally, laser diodes, used in the majority of cases, are in general modulated frequency-wise by their supply current, and therefore also, simultaneously, emission amplitude-wise.

Another example field of application of the invention is the radar field.

Modern radars use a so-called active antenna design in which the angular scanning function of the antenna is obtained not by rotation of the antenna itself but by that of its emission wave plane. The wave plane results from a phasing—in the direction sought—of elementary waves issuing from various radiating elements of the antenna. The phasing is generally obtained by the adjustment of delays on the transport routes of the different ultrahigh frequency signals. FIG. 2 shows this principle schematically.

The radiation produced by an emitter 13 is divided into n beams each passing through means 15, 17, 19, 21 for imposing a delay on them. The wave 23 emitted by the antennas 25 has its wave plane modified according to the different delays imposed.

The necessity of having a greater and greater number of radiating antenna elements in order to improve, notably, the angular resolution (2000 emitters are spoken of), and the need to provide an accurate management of the delays, lead to a complexity of the system which is difficult to control with conventional ultrahigh frequency techniques (sizes and weights incompatible with the requirement of certain devices, airborne devices notably).

DESCRIPTION OF THE INVENTION

The present invention concerns the use of components in an array, in planar and collective manufacturing technologies for implementing ultrahigh frequency emitters.

The invention therefore concerns an ultrahigh frequency emitting device having a number of lasers and N means making it possible to impose phase delays on the path of N laser beams, these means being implemented in an array or a bar.

The invention concerns in particular an ultrahigh frequency emitting device, having:

at least a first and a second laser, emitting at two different frequencies $\omega_1$ and $\omega_2$, means of slaving the first and the second laser frequency-wise, a mosaic or a bar or an array of N elements (N≧2) placed on the path of the beam of the second laser, each element making it possible to impose a phase delay on the bear or the portion of beam which passes through it, N means for mixing the beam emitted by the first laser and each of the N delayed beams, and for producing N signals of frequency $\omega_1-\omega_2$, N antenna-forming means for emitting radiation at the frequency $\omega_1-\omega_2$, The invention also concerns an ultrahigh frequency emitting device, having:

a plurality of N laser emitter pairs, implemented in a mosaic or an array or a bar, each laser emitter pair having a first and a second laser emitter emitting at a first and a second frequency $\omega_1$, $\omega_2$, which are different, an array or a bar of N elements, each of them being placed on the path of the second laser emitter of one of said laser emitter pairs, and each element making it possible to impose a chase delay on the beam of said second laser emitter, means of slaving each laser emitter pair, frequency-wise and phase-wise, N means for mixing each of the beams emitted by the first emitters of the N laser emitter pairs with each of the beams emitted by the second emitters of the N laser emitter pairs and delayed by the elements making it possible to impose a phase delay, and for producing N signals at the frequency $\omega_1-\omega_2$, N antenna-forming means for emitting radiation at the frequency $\omega_1-\omega_2$, The invention is based on a principle of ultrahigh frequency electromagnetic wave generation (a frequency which may reach several hundred GHz) by means of the beating—the heterodyning—of at least 2 electromagnetic waves in the optical domain (of much higher frequencies, of the order of $10^{14}$ Hz), generated by lasers. The use of elements in mosaics or arrays, for imposing phase delays, allows the implementation of a compact device.

The detection of frequency beats (a mixing function) is generally provided by a photodiode whose current is a non-linear function of the electromagnetic field.

One of the advantages of the invention is the possibility of "transporting" ultrahigh frequency signals with a low attenuation per unit length by virtue of an optical "carrier". The attenuation per unit length in the fibers is in fact only of the order of 0.1 dB/km whereas it is 0.1 dB/m in an ultrahigh frequency conductor (coaxial).

According to another aspect, the laser sources can be microlasers or VCSELs (vertical cavity surface emitting lasers). These components are also compatible with a collective implementation, in the form for example of mosaics or arrays.

The device according to the invention then does not require any device for correcting the received signal.

This is because the chip laser sources (or microlasers) have a very small emission line width, of the order of a few hundred KHz, much lower than that of laser diodes (MHz) or that of VCSELs (also MHz).

Furthermore, chip lasers can be modulated (optical) emission frequency-wise with no "crossed amplitude modulation" (which is not the case for laser diodes which are in general modulated frequency-wise by their supply current, and therefore also emission amplitude-wise) This frequency modification is for example obtained by electro-optical type modulation of the optical length of the microlaser cavity.

The invention also concerns an ultrahigh frequency emitting device, having:

- a plurality of N laser emitter pairs, implemented in a mosaic or an array or a bar, each laser emitter pair having a first and a second laser emitter emitting at a first and a second frequency $\omega_1$, $\omega_2$, which are different,
- means for slaving each laser emitter pair frequency-wise,
- means for modifying the frequency of one of the laser emitters of at least one laser emitter pair with resect to the frequency of the other laser emitter of said laser emitter pair,
- N means for mixing each of the beams emitted by the first emitters of the N laser emitter pairs with each of the beams emitted by the second emitters of the N laser emitter pairs and for producing a signal at the frequency $\omega_1-\omega_2$,
- N antenna-forming means for emitting radiation at the frequency $\omega_1-\omega_2$.

This device also has good compactness, on account of the structure of the laser emitters in a bar or a mosaic or an array. Moreover, the use of means for modifying the frequency of one of the laser emitters with respect to the frequency of the other emitter makes it possible to obtain a slippage of the phase of one of the laser emitters with respect to the phase of the other laser emitter. It is then no longer necessary to use specific means of varying the phases of the beams emitted by the lasers, as in the previous embodiments. Finally, the invention also concerns a radar device having an ultrahigh frequency emitter as described above.

The lasers or the laser emitters can be assembled in an array, a coupling or transmission by optical fibers being implemented between the elements making it possible to impose phase delays and the means for mixing the emitted beams.

The frequency slaving means can also be assembled in an array.

Finally, the beat signal forming means can be merged with the means for mixing either the beam emitted by the first laser and each of the N delayed beams, or each of the beams emitted by the first emitters of the N laser emitter pairs with each of the beams emitted by the second emitters of the N laser emitter pairs and delayed by the elements making it possible to impose a phase delay.

According to another aspect, the lasers or the laser emitters are assembled in an array and multiplexed by a multiplexer, an optical fiber connecting the multiplexer and a demultiplexer.

For this, laser sources shifted optical frequency-wise, by the multiplexing step, can be implemented. To that end, an adjustment of the cavity length is implemented: each laser cavity has, for example, associated with it a Bragg grating type mirror implemented on a corresponding guide of the multiplexer.

The invention therefore also concerns an optical device having:

- lasers or laser emitters (microlasers or laser diodes) implemented in a mosaic or an array,
- a multiplexing device having integrated optical guides, each optical guide corresponding for example to a laser source or a laser emitter or a laser cavity,
- a Bragg grating type mirror, implemented (for example: etched) on each guide of the multiplexing device.

BRIEF DESCRIPTION OF THE FIGURES

In any case, the characteristics and advantages of the invention will emerge more clearly in the light of the description which follows. This description concerns the example embodiments, given by way of a non-limitative explanation, referring to accompanying drawings in which.

DETAILED DESCRIPTION OF EMBODIMENTS OF THE INVENTION

Figure 1:
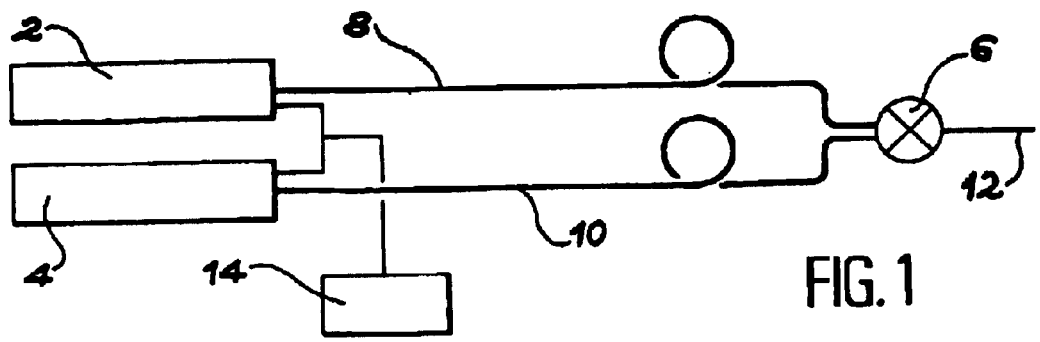
FIG. 1 illustrates the principle of the optical transportation of ultrahigh frequency signals with two lasers.

A first embodiment of the invention will be described with relation to FIG. 3A.

Two lasers 22, 24 emit at two different frequencies: Ω and Ω+ω. On the path of one of them there are placed means 52, 54, 56, 58 for generating phase delays. The on laser beams are transmitted by fibers 42, 44, 46, 48, 50 to mixers (optical photodetectors) 26, 28, 30, 32. The parts 34, 36, 38, 40 situated beyond the mixers constitute the antennas.

The two laser sources 22, 24 are slaved frequency-wise. The slaving is depicted schematically by the reference 25 in FIG. 3A. More precisely, it comprises (FIG. 3B) a photodiode 27 which receives a portion of each of in the beams emitted by the lasers 22, 24 and which produces a beat signal which serves as an input signal of a comparator 29. An ultrahigh frequency reference source 31 delivers its signal to the other input of the comparator 29. The latter produces an output signal used for controlling the frequency of the laser 24, for example by controlling an element 33 for adjusting the optical length of the cavity of the laser 24. Such an element is for example of the electro-optical or magneto-optical type.

Figure 4:
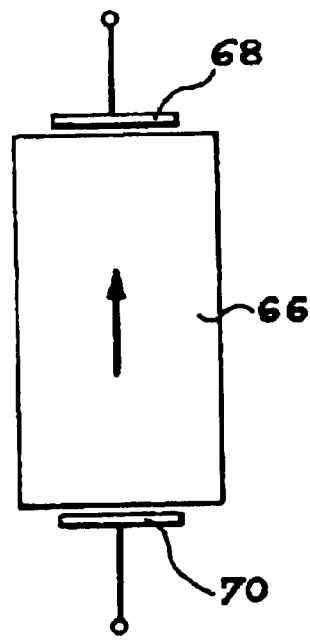
FIG. 4 depicts an electro-optical device.

An electro-optical element 60 is depicted in FIG. 4. A voltage is applied to it by means of electrodes 68, 70. The optical path of the laser beam is modified by the application of a voltage between the electrodes 68, 70. This is because there results therefrom a field E and an index $$n_{e_L} = n_e - \frac{r_{33} n_e^2 E}{2},$$

where $n_e$ is the index of the material 66 in the absence of any field, $r_{33}$ is the electro-optical coefficient, and E is the applied field.

There thus results therefrom a modification of the optical length of the cavity of the laser, and therefore of its emission frequency.

The electro-optical material 66 is, typically, $LiNbO_3$ or $LiTaO_3$ or any material whatsoever having a significant variation of its index under the action of an electric field (possibly a semiconductor).

Figure 5:
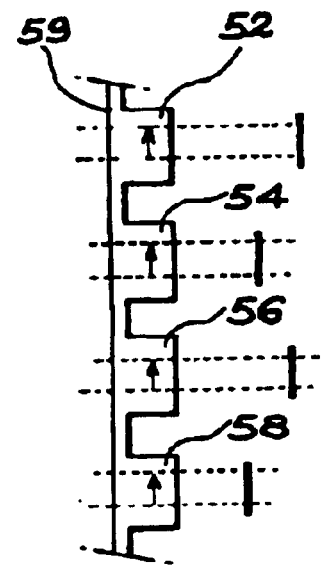
FIG. 5 depicts an array of phase shifters.

The means 52, 54, 56, 58 are implemented in bar or array form. These means can be of the magneto-optical or electro-optical type. FIG. 5 depicts four electro-optical elements 52, 54, 56, 58 placed on a support 59 (transparent to the desired wavelength), on which they are, for example, glued. The electro-optical materials are, furthermore, compatible with a collective implementation. Wafer manufacturing technologies make it possible to obtain simply, by sawing or polishing and sawing, the geometries of the modulators in bars or arrays on their support 59: there is then no longer any need of gluing steps.

According to one particular embodiment, the invention uses "chip" lasers, or microlasers. The structure of microlasers will first be reviewed.

It is described, for example, in the article by J. L. Aubert, entitled "Q-switched microchip lasers bring new applications to light" published in "Laser Focus World", June 1995.

The chip laser is a solid laser pumped by diode via, or not, an optical fiber. All the elements constituting the laser (amplification medium, mirrors, modulators, etc.) are integrated in a small volume ($<mm^3$) in order to form a compact monolithic assembly. The laser mirrors are, for example, directly affixed on the laser material, which is dielectric.

Conventionally, the laser material, constituting the active medium, is doped with neodymium (Nd) for a laser emission around 1.06 μm. This material can be chosen, for example, from amongst one of the following materials: YAG ($Y_3Al_5O_{12}$), LMA ($LaMgAl_{11}O_{19}$), $YVO_4$, YSO ($Y_2SiO_5$), YLF ($YLiF_4$) or $GdVO_4$, etc. It can also be a glass.

For emissions at other wavelengths, different dopants are chosen. In general, the active ions are chosen from amongst:

Nd for an emission around 1.06 μm (1.064 μm), and around 1.3 μm,

Er or an Er+Yb erbium-ytterbium co-doping for an emission around 1.5 μm,

Tm or Ho or a co-doping of thulium and holmium for an emission around 2 μm.

Depending on the nature of the laser material and the doping, various emission wavelengths are therefore possible. The two wavelengths 1.3 μm and 1.5 μm are advantageous for application to ultrahigh frequency transport by optical routes, since they are situated within the windows identified for applications to optical telecommunications (availability of specific components assured by this market).

Various specific developments (stable cavities, frequency modulation, etc.) have been implemented around the basic structure of microlasers.

In particular, the document EP-653 824 describes a microlaser with passive triggering for a saturable absorber. The document EP-724 316 describes a monolithic solid microlaser with active triggering by a low control voltage.

The documents cited above, incorporated by reference in the present description, also give methods of implementing microlasers. These methods are collective and make it possible to implement many microlasers simultaneously.

In particular, microlaser bars or arrays can be implemented: for this, all that is required is to modify the cutting step in the collective implementation method.

These microlasers can be incorporated in a device of the type described above with relation to FIG. 3A. The structure of the microlasers in an array is compatible with the array structure of the means 52, 54, 56, 58.

Also, instead of microlasers, VCSEL (vertical cavity surface emitting laser) arrays can be used, which can themselves also give rise to an array or bar implementation.

In all cases, the use of laser emitters in arrays or bars, in combination with the phase delay means, themselves implemented in arrays or bars, makes it possible to obtain an ultrahigh frequency emitting device which is very compact, and therefore compatible with the applications (for example, "radar" type applications) where a very large number of emitters is required.

The phase modulator described previously is positioned "downstream" of two sources slaved frequency difference-wise. It can also be advantageously used downstream of an assembly of a number of emitter pairs as far as the latter are slaved phase-wise (low-speed slaving, capable of being obtained in various ways: for example, thermally or electro-optically, as described later). In this case, the topology of the system is that shown schematically in FIG. 6A, one of the two beams of each pair of sources passing through a phase delay element 52, 54, 56, 58. Each pair is slaved frequency-wise in the manner described above with relation to FIG. 3B, the ultrahigh frequency reference source possibly being common to all the emitter pairs.

Figure 7:
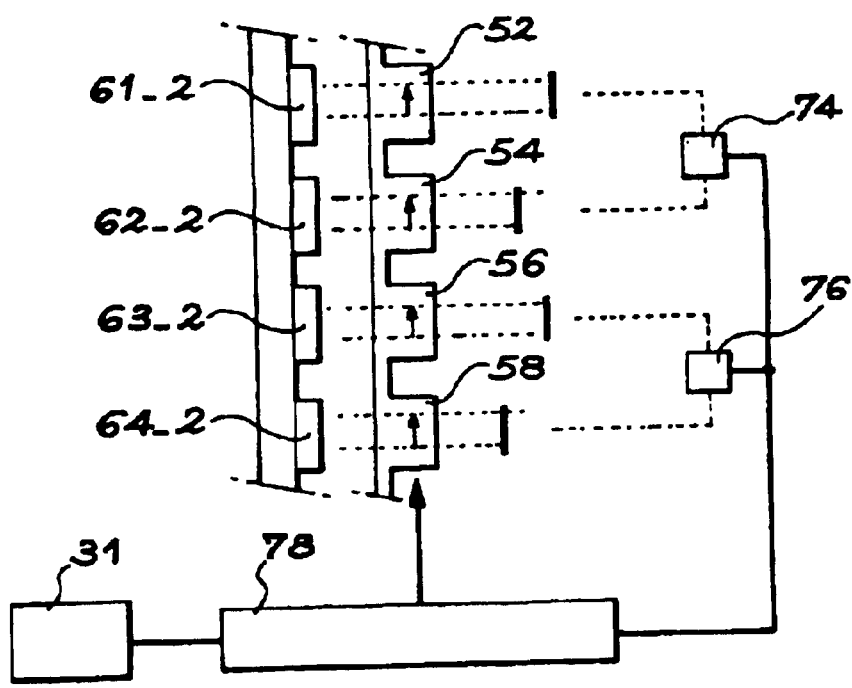
FIG. 7 depicts means for the phase slaving of the signal of a device according to the invention.

An array of emitters 61-2, 62-2, 63-2, 64-2 (the emitters 61-1, 62-1, 63-1, 64-1 are not depicted) on a wafer, with associated phase modulation means 52, 54, 56, 58, themselves also in an array structure, is illustrated in FIG. 7.

From a practical point of view, this topology has the advantage, by putting the sources in parallel, of providing a higher optical—or ultrahigh frequency—power, while retaining an overall array configuration.

Figure 6A:
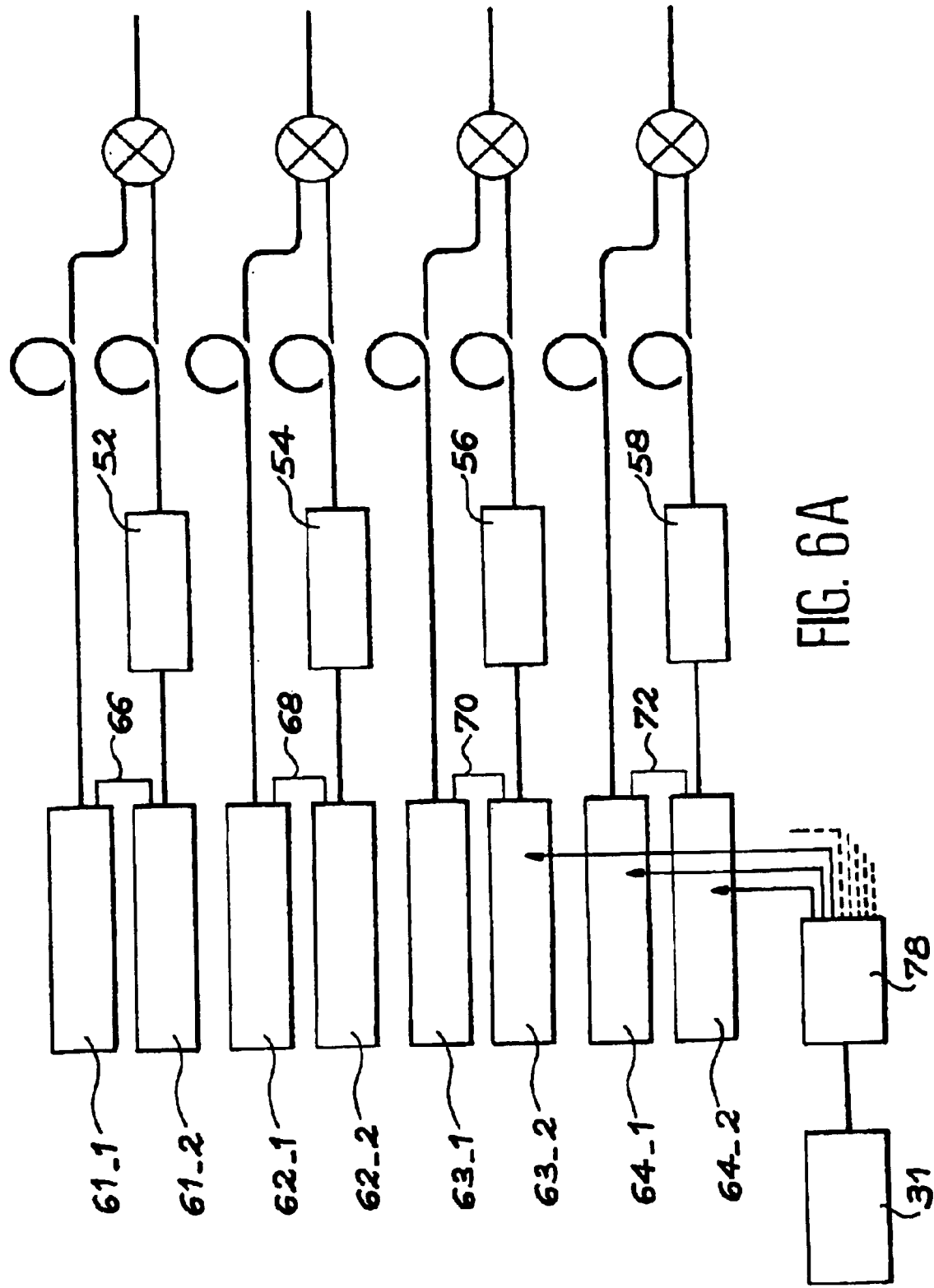
FIGS. 6A and 6B depict another embodiment of the invention, with an array of emitter pairs, the associated phase modulation means also being in an array structure, and the scheme for frequency slaving of the emitters.
Figure 6B:
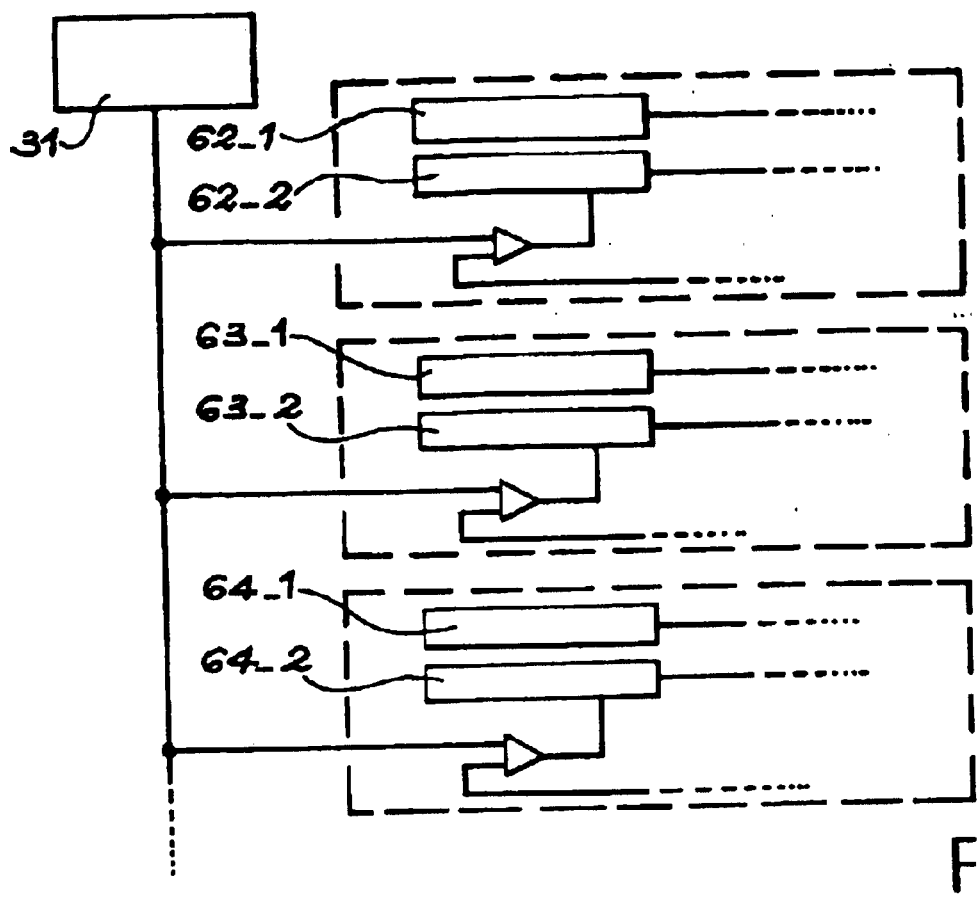

More precisely, the slaving function has, as illustrated in FIGS. 6A and 6B, two levels:

1) a first frequency difference slaving 66, 68, 70, 72, of the optical sources, fixed on an ultrahigh frequency reference source; this first level of slaving has already been described above (FIG. 3B).

2) a second slaving, of the phase difference of the optical sources between one another, implemented by the use, for the different microlaser pairs, of a common ultrahigh frequency reference source 31.

This ultrahigh frequency source 31 sends a common reference signal to all the microlaser pairs 62-1, 62-2, 63-1, 63-2, 64-1, 64-2.

Figure 2:
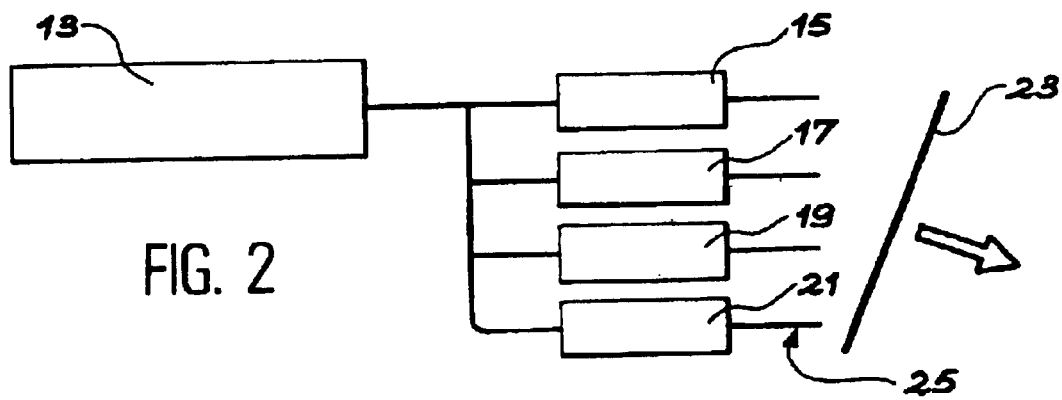
FIG. 2 depicts schematically the principle of an active antenna.

The resulting signal can itself be controlled so as to allow modulation of the direction of the plane 23 of the emitted wave (see FIG. 2). To this end (FIG. 7), photodiodes 74, 76 take off the signals issuing, for example, from neighboring modulator pairs 56, 58 or 52, 54 in order to form a beat signal from the microlaser pair beams. Each of these signals is sent to means 78 which detect the frequency and phase difference with the reference source 31 and correct this difference by voltage control of each of the electro-optical modulators.

Figure 3A:
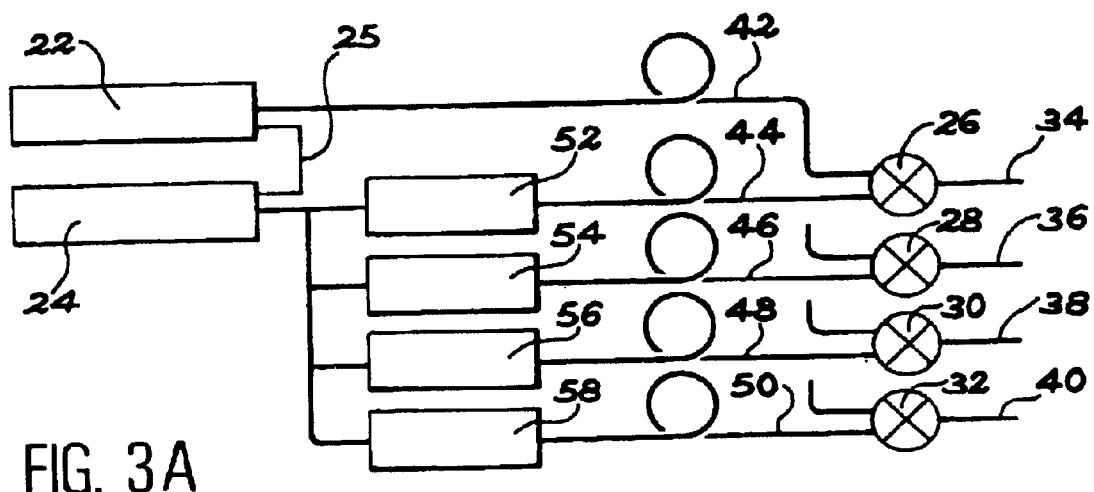
FIGS. 3A and 3B depict one embodiment of the invention.
Figure 3B:
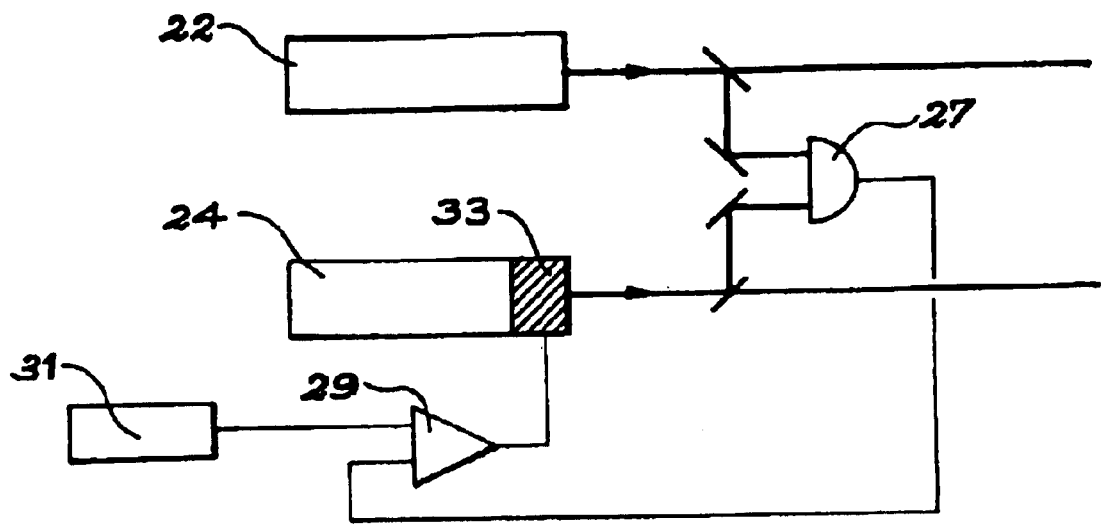

The same type of slaving can be used for the device of FIG. 3A. But it is less necessary since the phase rotation is then imposed by the two sources. Phase control can therefore be applied, in this case, with no slaving.

A variant of FIG. 6A would consist of placing a phase delay element for each beam of each source pair, for example a phase delay of $+\phi/2$ on the path of the beams issuing from the sources 61-1, 62-1, 63-1 and 64-1 and a delay of $-\phi/2$ on the paths of the beams issuing from the sources 61-2, 62-2, 63-2, 64-2. More generally, a symmetrical and differential phase shift can be implemented on the two routes.

In the embodiments described above, the sources are considered as fixed frequency-wise and phase-wise (by slaving). The phase of the multiple ultrahigh frequency emitters can be modified by making the relative frequency of each of the emitter pairs slip (for a short time). The advantage, for phase modulation, of this frequency drift approach lies in the capability of modifying the phase in values much greater than $+/-\pi$ (unlike direct modulation).

Figure 8A:
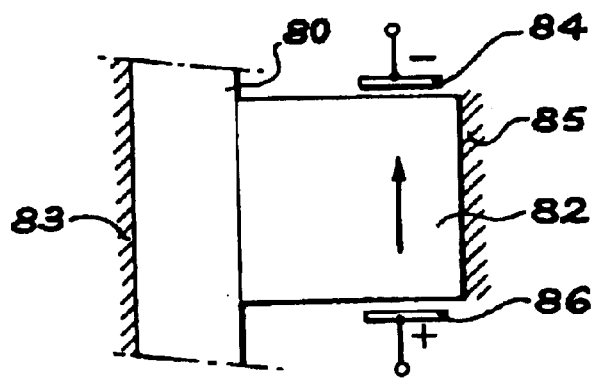
FIG. 8A depicts an intra-cavity electro-optical modulator.

Optical frequency "drift" of the lasers can be obtained, as shown schematically in FIG. 8A, by modifying the optical length of their cavity. This modification of optical length is for example obtained by an electro-optical effect of the type of those already mentioned previously. The laser active medium 80 and the electro-optical material 82 both form part of the microlaser cavity delimited by the cavity mirrors 83, 85. Here again the optical components for microlaser with modulator are compatible with a collective implementation. The application of a voltage between the electrodes 84, 86 brings about a variation in index of the electro-optical material 82, and therefore in the optical length of the microlaser cavity.

Figure 9:
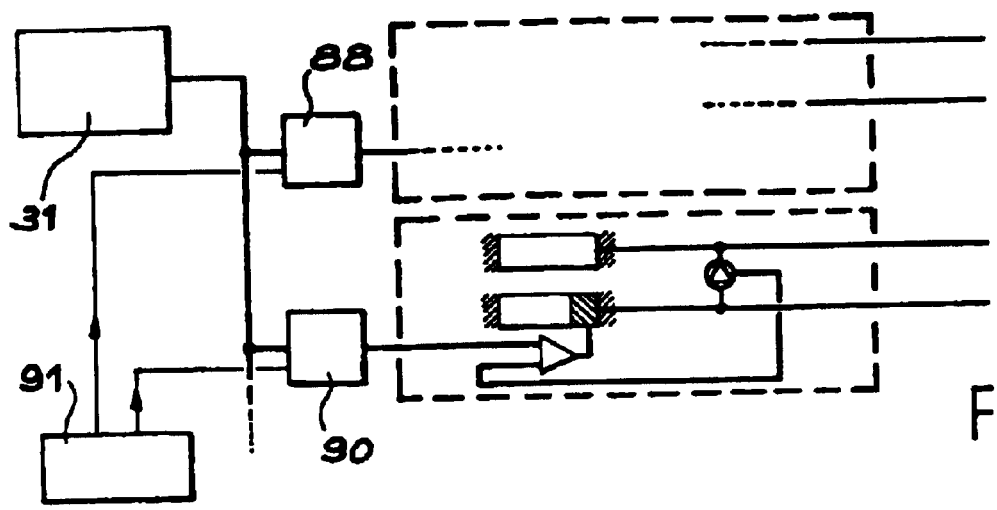
FIG. 9 depicts the frequency slaving of the device of FIG. 8B.

There results therefrom a variation in the emission frequency of the laser. In practice, the system has the overall structure depicted in FIG. 8B, a structure in which an electro-optical element on the path of the laser beams no longer appears: a phase relationship is imposed between two laser sources by making the frequency of one of the lasers slip until the desired phase difference is reached. For example, means 88, 90 (to give examples) can be placed on each route (see FIG. 9) in order to impose a phase delay of the ultrahigh frequency reference signal. The "slippage" of the phase of the reference brings about a slippage of the frequency of the laser (since the reference signal of the corresponding comparator is modified), and therefore a slippage of the phase of one laser with respect to the other. The frequency slippage control can for example be obtained by a phase-locked loop (PLL) controlled by an antenna orientation control center 91.

Figure 8B:
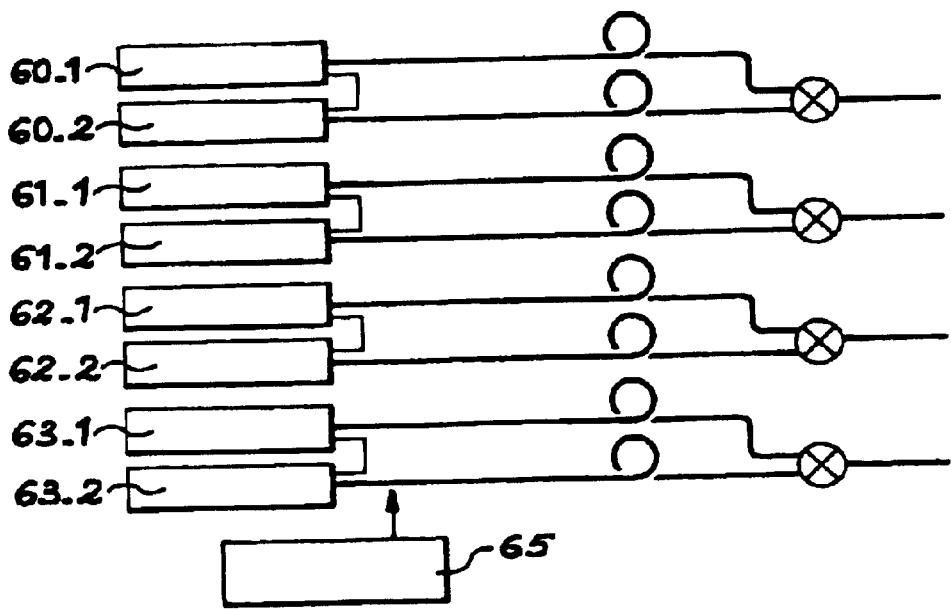
FIG. 8B depicts microlaser sources slaved phase difference-wise, by frequency drift.

In FIG. 8B, the reference 65 designates a device providing a phase reference.

It is sought to reduce, as far as possible, the control voltage of the device 82 of FIG. 8A by bringing the electrodes 84, 86 closer together. In the case depicted (of a configuration for modulation at right angles to the axis of the laser), the cross-section of the laser beam can thus be decreased by the use of a so-called stable laser cavity configuration. A typical value of the modulation voltage—for the case of crystals—is then 10 MHz/V.

Each radiation source pair can advantageously be replaced by a dual frequency source. The frequency-wise and phase-wise slaving is then the same as that described above, but the device obtained is even more compact and the slaving is less constrained since any drift on the cavity of the lasers has a second order effect on the frequency difference of the double emitters. Dual frequency laser sources are described in the article by M. Brunel et al. already cited above.

Furthermore, FIG. 8 gave the example of an electro-optical modulation. A semiconductor modulation can also be implemented, with the advantage of a modulation passband intrinsically higher than that obtained with electro-optical crystals. Moreover, a planar and more compact geometry is then obtained.

Another application of the invention concerns radar systems.

The collective manufacturing technology for the phase modulators is advantageous—for the radar application—through the array aspect of the structure which this makes possible to obtain. Furthermore, the collective manufacturing technology for the microlasers is also advantageous in view of this application. This source structure (with phase modulation external or internal to the cavity) can be added to by system functions like, for example, those of slaving of the frequency, management of the phases with respect to a reference signal, or connection to the optical fibres for transporting the ultrahigh frequency information. The end result is a system composed of the superposition of multiple "slices" with an optical or electronic function, which are extremely compact despite the complexity aimed at (slaving of several thousand ultrahigh frequency emitters).

Figure 10:
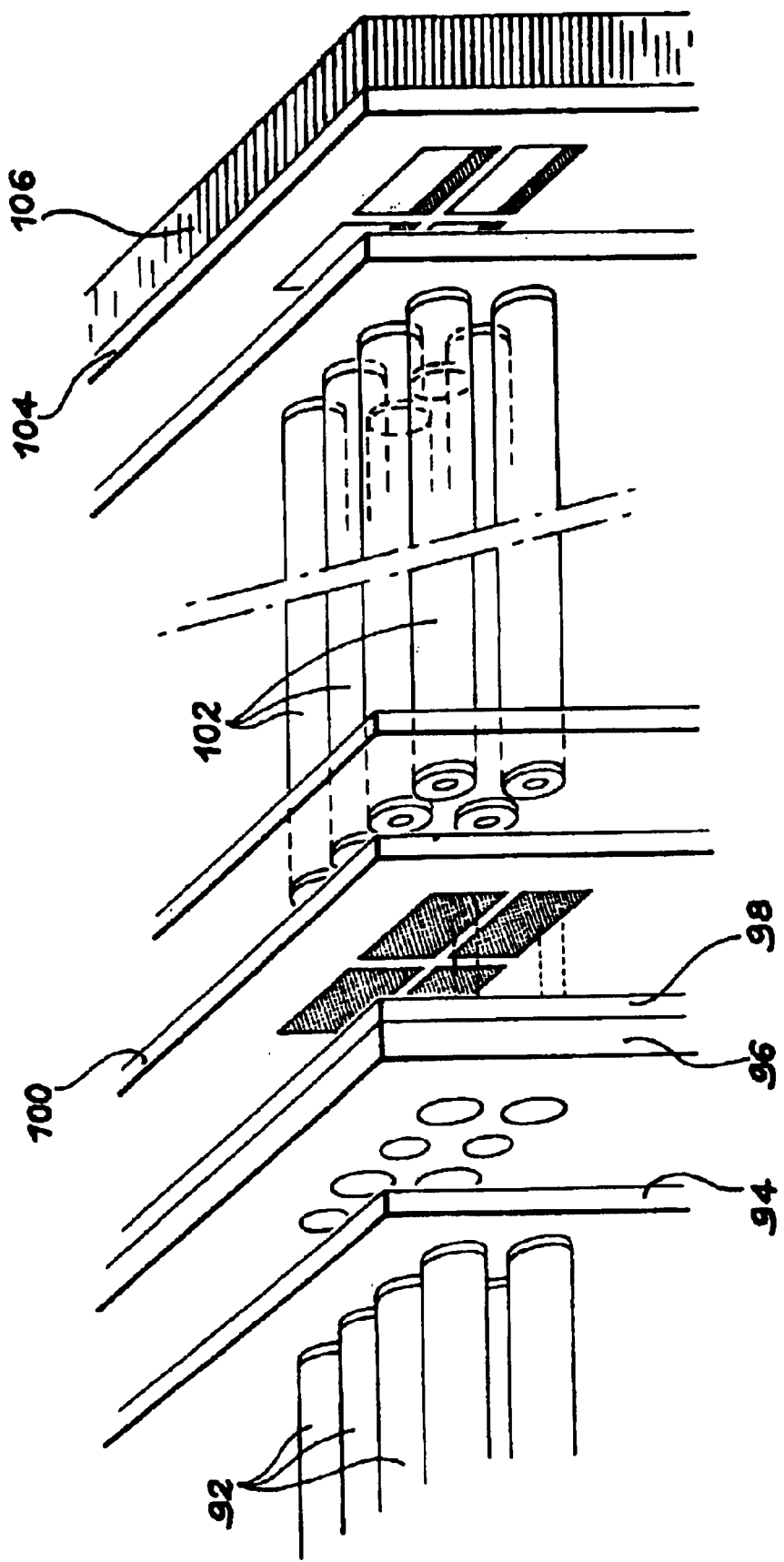
FIG. 10 depicts an active antenna radar operating using optical heterodyning, with microlaser sources.

FIG. 10 depicts schematically a radar system based on the optical ultrahigh frequency routes being implemented in array form. A variant with bars can be implemented to optimize the manufacturing costs.

The device depicted has means 92 for coupling fibers 94 conveying pumping beams issuing from an array of pumping diodes (not depicted in FIG. 10). The pumping beams are next directed to an array 96 of chip lasers (or microlasers or VCSELs) provided with an array 98 of phase and/or amplitude modulation means. The reference 100 designates an array of means for acting on the phase and/or amplitude slaving of the chip lasers. The phase slaving means are for example means of the type of those already described above.

In particular, phase and/or amplitude set points are regulated by beat signals coming from diodes which can be situated either on the path of the laser beams (upstream of the optical fibers) or at the end of the chain, the slaving diodes then being merged with the antenna diodes of the array 104. This second possibility makes it possible to take into account phase delays connected with the optical fibers 102. The beat signal is, in all cases, sent back to the slaving means of the array 100. In the second case, it can be sent back by the fibers 102 or by separate optical fibers. The optical fibers 102 make it possible to transport the modulated beams to an array 104 of photodiodes, which have a beam mixing function. These are means of detecting beat signals with a view to phase and/or amplitude slaving. The reference 106 designates an array of active antennas provided with a suitable electronic amplification.

Amplitude adjustment of the different emitters can be implemented by modulation of the pump power of the lasers. The modulation frequency performance is however then limited (<a few 100 kHz) for reasons inherent in the laser material (level life time, in particular).

Amplitude modulation of the sources is therefore preferably implemented by electro-optical modulation. A description of this type of modulation is given in the work by A. Orszag and G. Heppner entitled "Lasers and their applications", Masson, p. 1450, 1980.

Figure 11:
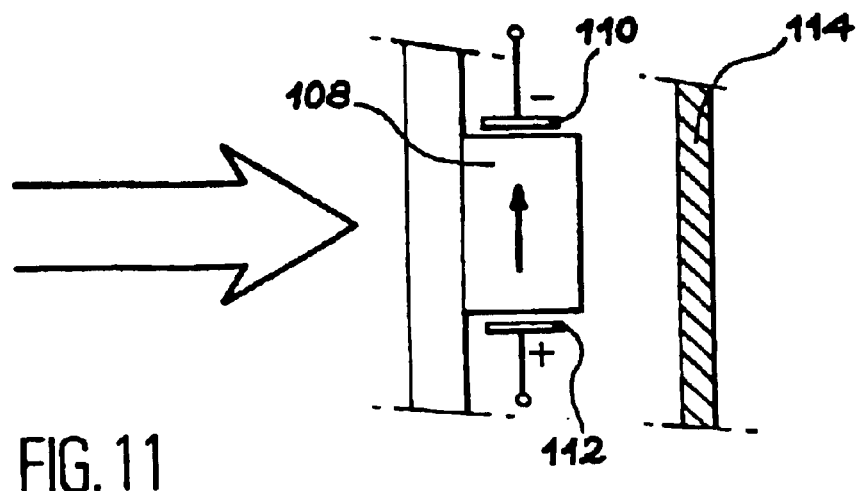
FIG. 11 depicts a microlaser cavity equipped with an electro-optical modulator and associated with an analyzer.

As illustrated in FIG. 11, an electro-optical modulator is based on the change in polarization direction of a light wave upon passing through an anisotropic medium 108, as a function of an external electrical field applied by means of electrodes 110, 112. The effect of this change in polarization direction—analyzed by means of a linear polarizer 114—is an amplitude modulation of the optical signal. Preferably, the analyzer 114 is assembled on the electro-optical material 108.

On the assumption that the laser wave is not perfectly polarized on entry to the modulator, a polarizer (analogous to that of the analyzer) can be introduced upstream of the modulator.

Consequently, FIG. 10 describes the overall structure of an active antenna radar operating using optical heterodyning. The phase and/or amplitude modulation or control means can be situated upstream of the optical fiber transportation of the ultrahigh frequency signals. They can also (this is the case depicted in FIG. 10) be positioned in a distributed fashion between the upstream and the downstream of the fiber network: upstream of the fibers, the means of acting on the phase and amplitude of the waves is then found; downstream, the means of detecting the difference from the "slaving set point", this set point, and the difference from this set point, possibly being advantageously transmitted by the fibers network.

In the structure of the system described above in relation to FIG. 10, there appear as many optical fibers as ultrahigh frequency routes to be implemented (that is, for example, 2000 in an "objective" configuration). It is possible to reduce the number of these fibers by wavelength multiplexing (as performed in telecommunication with multiplexers, of "Phasar" type for example).

For this, chip laser sources are implemented, shifted optical frequency-wise by the multiplexing step (typically 0.8 nm), by adjustment, for example, of their cavity length.

Figure 12:
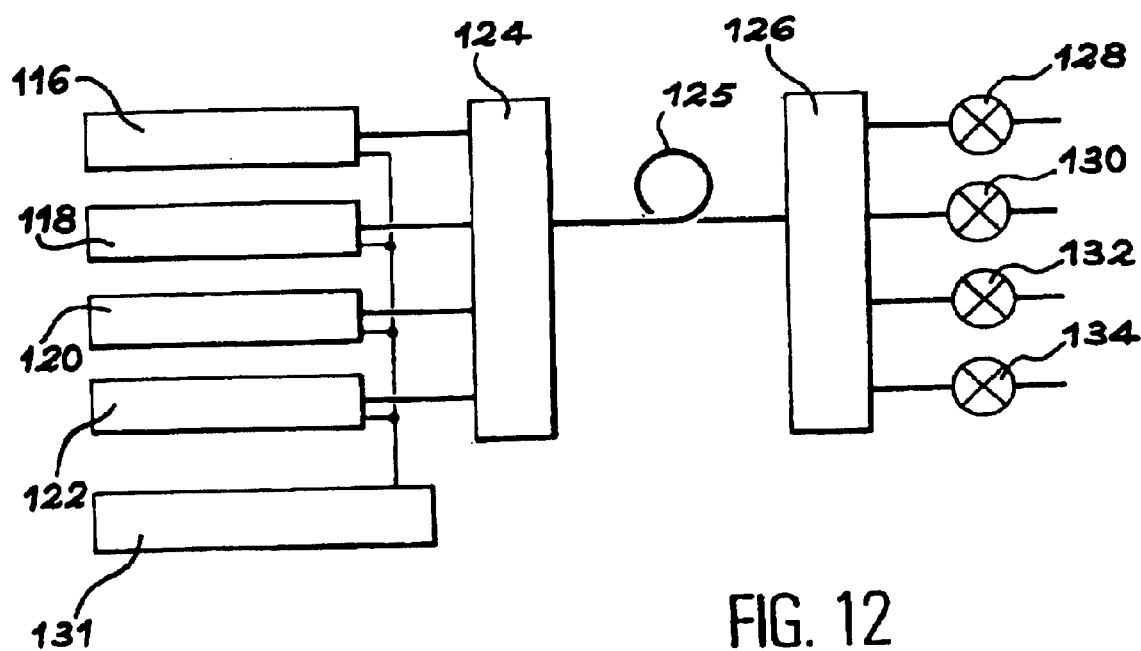
FIG. 12 depicts a device according to the invention, with wavelength multiplexing in order to reduce the number of optical fibre channels.

FIG. 12 shows this approach schematically with the implementation of dual frequency chip laser sources: the microlaser 116 emits at the frequencies $\Omega_1$ and $\Omega_1+\omega$, the microlaser 118 at the frequencies $\Omega_2$ and $\Omega_2+\omega$, etc. The reference 124 designates an optical multiplexer and the reference 126 a demultiplexer.

A phase reference can be obtained for each of the microlasers, as already described previously. A means for providing a phase reference is indicated in FIG. 12 by the reference 131. Each of the demultiplexed beams is next detected by a photodetector 128, 130, 132, 134.

Figure 13A:
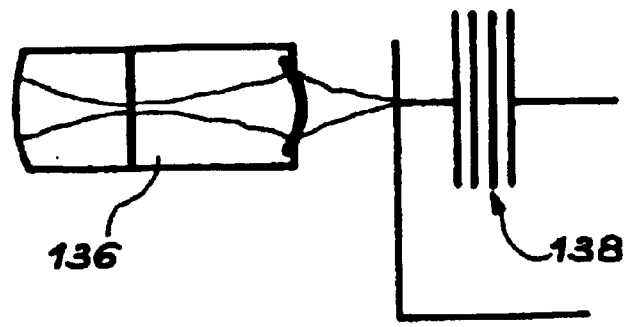
FIGS. 13A and 13B depict microlasers equipped with grating type mirrors.
Figure 13B:
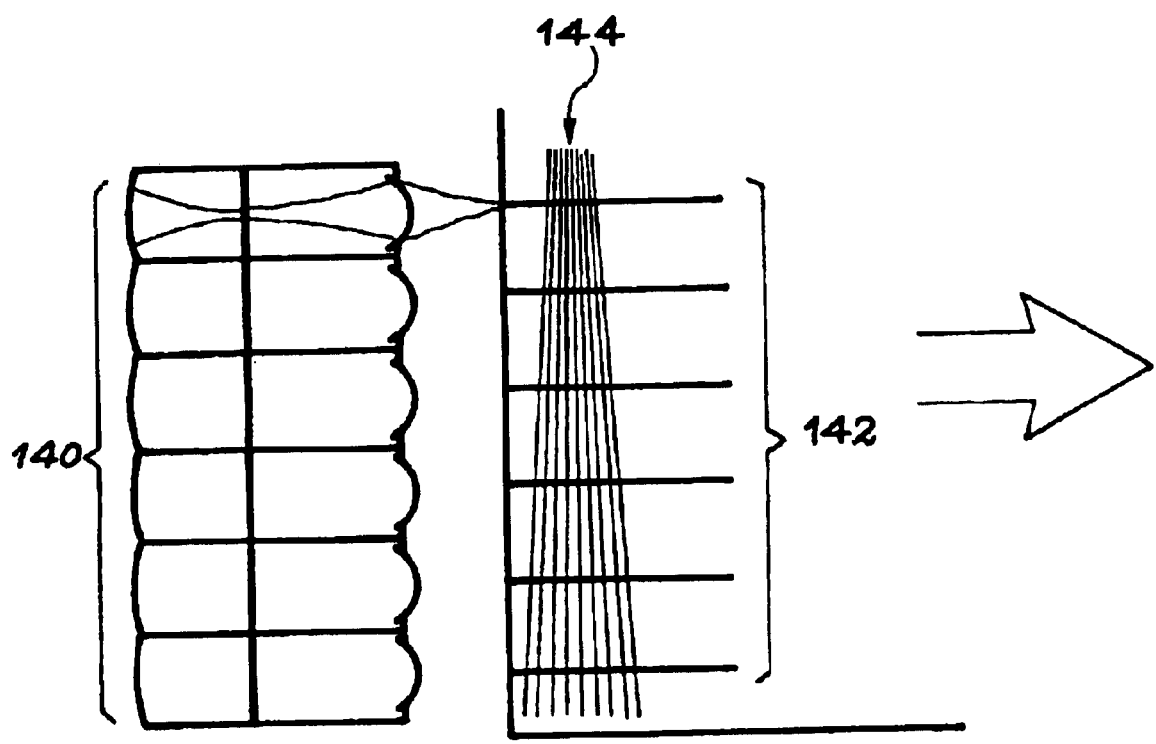

From a practical point of view, adjustment of the lengths of the different cavities can be implemented by a "distributed" cavity. As illustrated in FIG. 13A, each laser cavity 136 has associated with it a Bragg grating type mirror 138, advantageously implemented on the corresponding guide (in integrated optics) of the multiplexing device. FIG. 13B depicts a microlaser assembly 140, the corresponding wave guides 142 and the grating 144 etched on the wave guides. Laser diodes are compatible with this scheme, as a replacement for the microlasers. But coupling of microlasers is easier to implement and, furthermore, microlasers are purer spectrally. Finally, dual frequency lasers can also be used.

The invention therefore also concerns an optical device having:
- lasers or laser emitters (microlasers or laser diodes) implemented in a mosaic or an array,
- a multiplexing device having integrated optical guides, each optical guide corresponding for example to a laser source or a laser emitter or a laser cavity,
- a Bragg grating type mirror, implemented (for example, etched) on each guide of the multiplexing device.

What is claimed is:

1. An ultrahigh frequency emitting device, having a plurality of laser emitter pairs, each of said laser emitter pairs having a first and a second laser emitter emitting electromagnetic waves in the optical domain, at a first and a second frequency $\omega_1$, $\omega_2$, respectively, $\omega_1$ and $\omega_2$ being different; a number of phase delay elements, each being placed in the path of said second laser emitter of one of said laser emitter pairs, and each said phase delay element adapted to impose a phase delay on the beam of said second laser emitter; means for slaving each said laser emitter pair in one of a frequency and phase manner, and a frequency, phase, and amplitude manner; a number of means for mixing each of the beams emitted by said first emitters with each of the beams emitted by said second emitters, and delayed by said phase delay elements thereby imposing a phase delay, and producing a number of signals at the ultrahigh frequency $\omega_1-\omega_2$ by heterodyning of said electromagnetic waves; means for converting optical signal to an RF signal; and a number of antenna-forming means for emitting radiation at the frequency $\omega_1-\omega_2$.

2. The device of claim 1, wherein said laser emitters are microlasers.

3. The device of claim 1, wherein said phase delay elements imposing a phase delay are selected from the group consisting of electro-optical magneto-optical, and thermo-optical elements.

4. The device of claim 1, wherein said frequency slaving means comprises means for forming a beat signal from the beams emitted by said first and second laser emitters of each said laser emitter pair, and means for adjusting the emission frequency of one of said first and second laser emitters of said laser emitter pair according to the beat signal.

5. The device of claim 4, wherein said means for adjusting the emission frequency comprises means for comparing the beat signal to a reference signal provided by a reference source, and means for modifying an optical length of a cavity of said one of said first and second laser emitters for emission frequency adjustment.

6. The device of claim 5, wherein said reference source is common to all of said laser emitter pairs.

7. The device of claim 1, which further comprises means for slaving said phase delay according to a beat signal between the beam which passes through said phase delay element and another beam.

8. A radar device having an ultrahigh frequency emitting device as in claim 1, with said first and second laser emitters being assembled in an array, a transmission by optical fibers being implemented between said phase delay elements, and means for mixing the emitted beams.

9. The radar device of claim 8, wherein said frequency slaving means is arranged in an array.

10. The radar device of claim 8, wherein said frequency slaving means comprises means for forming a beat signal from the beams emitted by said first and second laser emitter of each said laser emitter pair, and means for adjusting the emission frequency of one of said first and second laser emitters of said laser emitter pair according to the beat signal, said beat signal forming means being merged with said means for mixing one of the beam emitted by the first laser emitter with each of the delayed beams, or each of the beams emitted by said first laser emitters with each of the beams emitted by said second laser emitters and delayed by the phase delay elements to impose a phase delay.

11. A radar device having an ultrahigh frequency emitting device as in claim 1, with said first and second laser emitters being assembled in an array and multiplexed by a multiplexer, an optical fiber connecting the multiplexer and a demultiplexer.

12. The device of claim 11, wherein each said first and second laser emitters has a cavity and wherein said cavities of said first and second laser emitters are frequency shifted with respect to one another.

13. The device of claim 12, wherein said cavities are frequency shifted by a length adjustment.

14. The device of claim 13, wherein each said cavity is associated with a Bragg grating type mirror, implemented on a corresponding guide of said multiplexer.

15. The radar device of claim 11, wherein said frequency slaving means is arranged in an array.

16. The radar device of claim 11, wherein said frequency slaving means comprises means for forming a beat signal from the beams emitted by said first and second laser emitters of each said laser emitter pair, and means for adjusting the emission frequency of one of said first and second laser emitters of said laser emitter pair according to the beat signal, said beat signal forming means being merged with said means for mixing arm of the beam emitted by the first laser emitter with each of the delayed beams, or each of the beams emitted by said first laser emitters with each of the beams emitted by said second laser emitters and delayed by the phase delay elements to impose a phase delay.

17. A device according to claim 1 wherein the laser emitters constitute an arrangement selected from the group consisting of a mosaic, an array and a bar.

18. An ultrahigh frequency emitting device, having a plurality of laser emitter pairs, each said laser emitter pair having a first and a second laser emitter emitting electromagnetic waves in the electromagnetic domain, at a first and a second frequency $\omega_1$, $\omega_2$, $\omega_1$ and $\omega_2$ being different; means for frequency slaving each said laser emitter pair; means for modifying the frequency of one of said laser emitter of at least one of said laser emitter pairs with respect to the frequency of the other laser emitter of said laser emitter pair; a number of means for mixing each of the beams emitted by said first emitters with each of the beams emitted by said second emitters, and for producing a signal at the ultrahigh frequency $\omega_1-\omega_2$ by heterodyning of said electromagnetic waves; means for converting an optical signal to an RF signal; a number of antenna-forming means for emitting radiation at the frequency $\omega_1-\omega_2$.

19. The device of claim 18, wherein said laser emitters are microlasers.

20. The device of claim 18, wherein said first and second laser emitters of each pair are constituted by a dual frequency source, emitting at the respective frequencies $\omega_1$ and $\omega_2$.

21. The device of claim 18, wherein said means for modifying the frequency comprises an electro-optical modulator.

22. The device of claim 21, wherein said electro-optical modulator is a semiconductor modulator.

23. A device according to claim 18 wherein the laser emitters constitute an arrangement selected from the group consisting of a mosaic, an array and a bar.

* * * * *